(12) United States Patent
Mase

(10) Patent No.: US 7,288,437 B2
(45) Date of Patent: *Oct. 30, 2007

(54) CONDUCTIVE PATTERN PRODUCING METHOD AND ITS APPLICATIONS

(75) Inventor: Akira Mase, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/048,767

(22) Filed: Feb. 3, 2005

(65) Prior Publication Data

US 2005/0148165 A1 Jul. 7, 2005

Related U.S. Application Data

(60) Division of application No. 09/995,866, filed on Nov. 26, 2001, now abandoned, which is a division of application No. 08/219,853, filed on Mar. 30, 1994, now Pat. No. 6,383,327, which is a continuation of application No. 07/807,747, filed on Dec. 17, 1991, now abandoned, which is a continuation of application No. 07/442,453, filed on Nov. 30, 1989, now abandoned, which is a continuation of application No. 07/136,567, filed on Dec. 22, 1987, now abandoned.

(30) Foreign Application Priority Data

Dec. 24, 1986 (JP) ................................. 61-310493

(51) Int. Cl.
*H01L 21/00* (2006.01)

(52) U.S. Cl. ...................... 438/118; 438/108; 438/611; 438/613; 156/291; 29/832; 29/836

(58) Field of Classification Search ................ 438/108, 438/119, 611, 613; 156/291; 29/832, 836
See application file for complete search history.

(56) References Cited

U.S. PATENT DOCUMENTS 3,079,282 A 2/1963 Haller et al.
3,621,564 A 11/1971 Tanaka et al.

(Continued)

FOREIGN PATENT DOCUMENTS

EP 0 154 443 9/1985

(Continued)

OTHER PUBLICATIONS

IBM Technical Disclosure Bulletin, Feb. 1966, vol. 8, No. 9.

(Continued)

*Primary Examiner*—Wael Fahmy
*Assistant Examiner*—Pamela E Perkins
(74) *Attorney, Agent, or Firm*—Eric J. Robinson; Robinson Intellectual Property Law Office, P.C.

(57) ABSTRACT

An improved method of forming an electrode pattern on a substrate is described. The substrate is coated with a first conductive film and subjected to baking. On the first conductive film is then overlied a second conductive film which mends possible fissures of the first conductive film which, besides, would produce open circuits in the pattern.

19 Claims, 5 Drawing Sheets

U.S. PATENT DOCUMENTS

| | | |
|---|---|---|
| 3,822,467 A | 7/1974 | Symersky |
| 3,892,635 A * | 7/1975 | Mallico .................... 205/118 |
| 3,928,658 A | 12/1975 | Van Boxtel et al. |
| 3,983,284 A | 9/1976 | Croset |
| 4,105,816 A | 8/1978 | Hori |
| 4,113,578 A | 9/1978 | Del Monte |
| 4,113,981 A | 9/1978 | Fujita et al. |
| 4,145,120 A | 3/1979 | Kubota |
| 4,201,801 A | 5/1980 | Hori |
| 4,327,124 A | 4/1982 | DesMarais, Jr. |
| 4,385,976 A | 5/1983 | Schuster-Wolden et al. |
| 4,403,398 A * | 9/1983 | Laurie et al. ................. 438/73 |
| 4,427,715 A | 1/1984 | Harris |
| 4,462,883 A | 7/1984 | Hart |
| 4,510,179 A | 4/1985 | Honjo et al. |
| 4,667,401 A | 5/1987 | Clements et al. |
| 4,680,226 A | 7/1987 | Takeda |
| 4,693,770 A | 9/1987 | Hatada |
| 4,756,756 A | 7/1988 | Cassat |
| 4,784,972 A | 11/1988 | Hatada |
| 5,138,145 A * | 8/1992 | Nakamura et al. ....... 250/208.1 |
| 6,040,056 A | 3/2000 | Anzaki et al. |

FOREIGN PATENT DOCUMENTS

| | | |
|---|---|---|
| FR | 2 182 209 | 4/1973 |
| FR | 2 525 209 | 10/1983 |
| GB | 2 032 127 | 4/1980 |
| GB | 2 064 233 | 6/1981 |
| GB | 2 160 693 | 12/1985 |
| JP | 51-102466 | 9/1976 |
| JP | 53-092465 | 8/1978 |
| JP | 58-009124 | 1/1983 |
| JP | 58-148434 | 9/1983 |
| JP | 60-092648 | 5/1985 |
| JP | 60-107845 | 6/1985 |
| JP | 60-108822 | 6/1985 |
| JP | 60-180151 | 9/1985 |
| JP | 61-256657 | 11/1986 |

OTHER PUBLICATIONS

Mitchell et al., "Processing Techniques for Fabricating Thick Film Copper/Dielectric Multilayer Structures," pp. 1-10, May 14-16, 1979, IEEE 29th Electronic Components Conference.

* cited by examiner

US 7,288,437 B2

CONDUCTIVE PATTERN PRODUCING METHOD AND ITS APPLICATIONS

BACKGROUND OF THE INVENTION

This invention relates to a conductive pattern producing method, and more particularly, relates to an improvement for a conductive pattern producing method which makes the pattern thus produced by the method more credible.

Heretofore, the interest of operators in manufacturing liquid crystal devices which comprises a pair of glass substrates and electrode pattern including addressing lines and signal lines for producing a matrix arrangement, is directed to how to form a pattern on the substrates without defects and with a high reliability of the pattern. Also the device generally includes an IC chip for driving the liquid crystal device. The facilitation and credibility of the connection between the IC chip and the pattern is always in question. Particularly, where a pattern is formed on a glass substrate, fissures are likely to occur in the pattern which cause disconnections in circuitry.

SUMMARY OF THE INVENTION

It is therefore an object of the invention to provide a method for producing a credible pattern.

In order to accomplish the object of the invention, patterns are manufactured with double-layered film.

BRIEF DESCRIPTION OF THE INVENTION

FIGS. 1(A) to 1(D) are cross-sectional views showing a method of manufacturing a conductive pattern in accordance with the present invention.

Figure 1A:
Figure 1B:
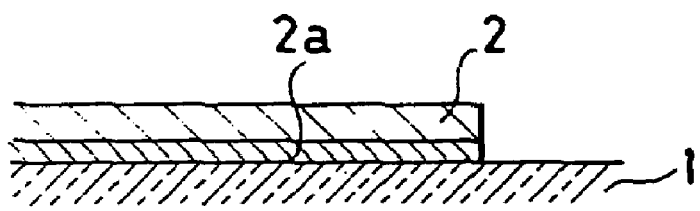
Figure 1C:
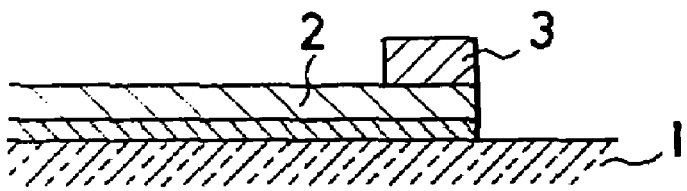
Figure 1D:
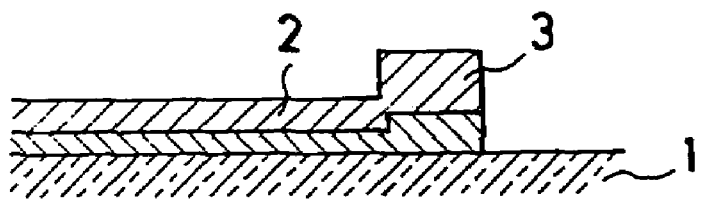
Figure 2A:
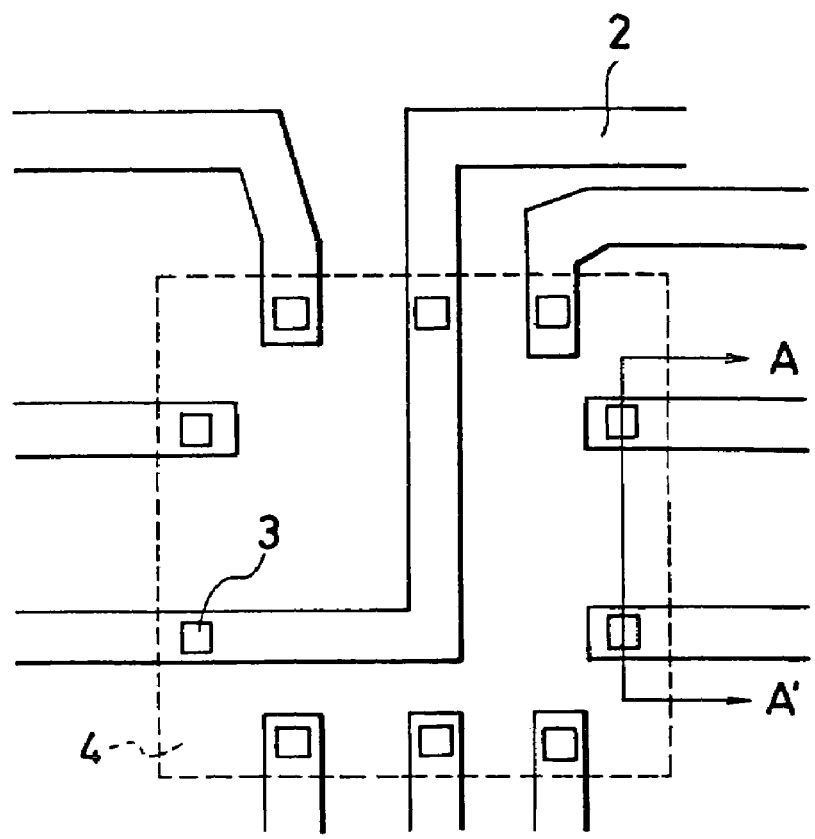
Figure 2B:
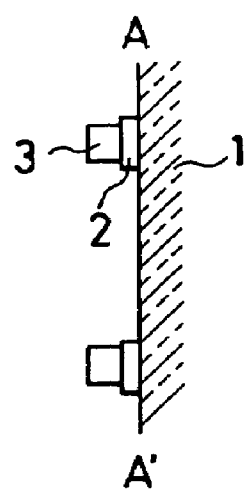

FIGS. 2(A) and 2(B) are a plan view and cross-sectional partial view showing a pattern formed in accordance with the present invention.

Figure 3A:
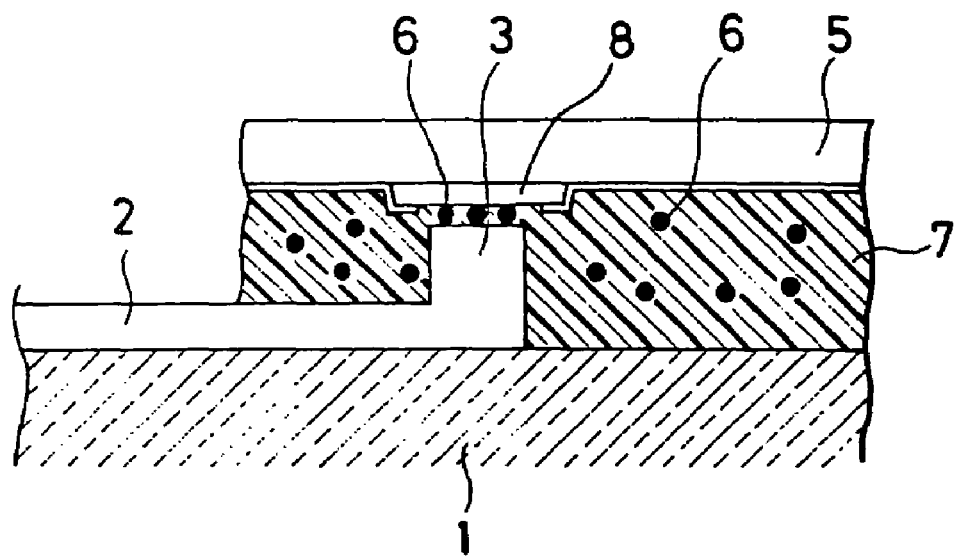
Figure 3B:
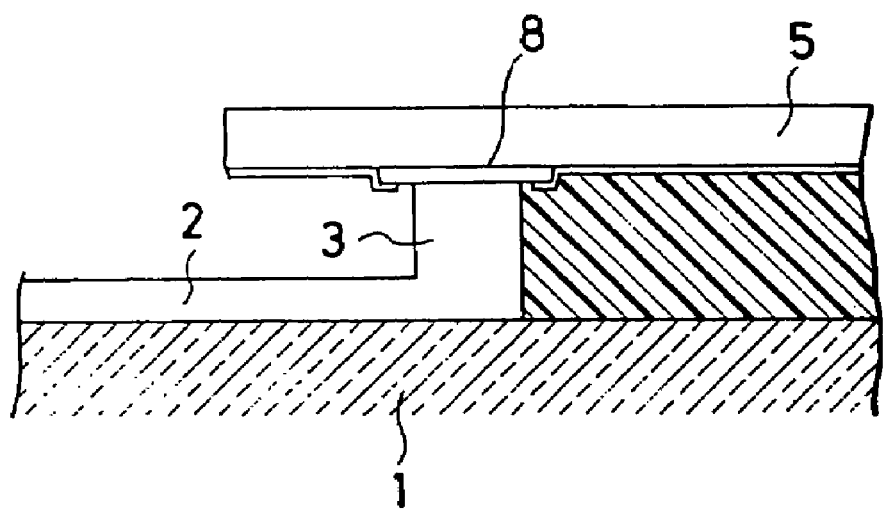

FIGS. 3(A) and 3(B) are cross-sectional partial views showing contact portions between IC chips and conductive patterns in accordance with the present invention.

Figure 4A:
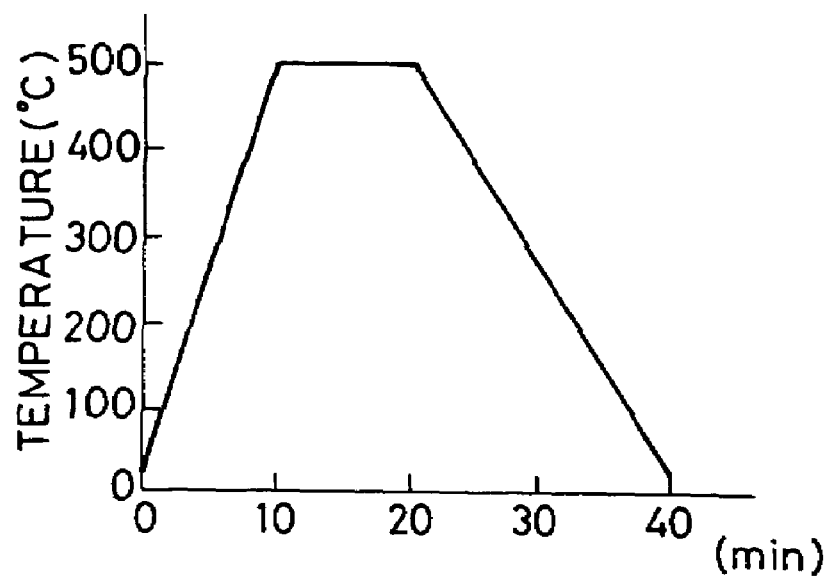
Figure 4B:
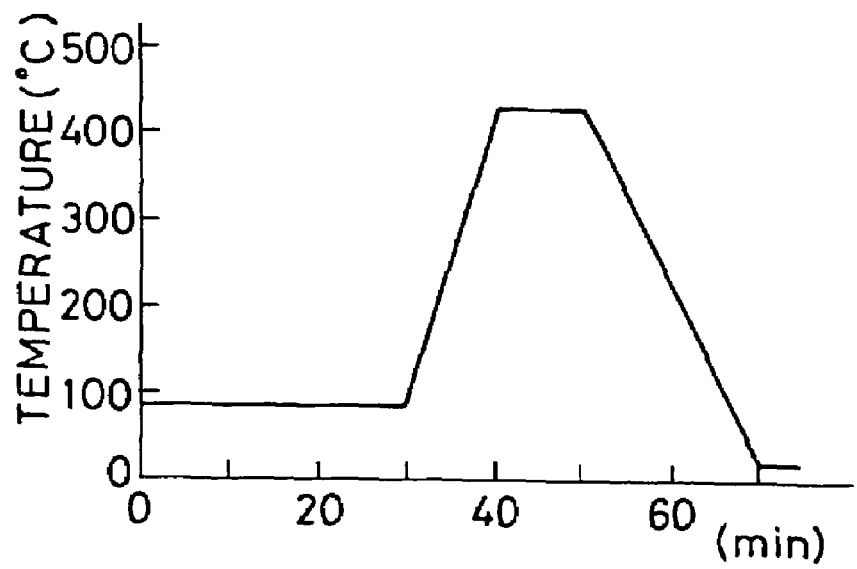

FIGS. 4(A) and 4(B) are graphical diagrams of temperature curves which are used in methods in accordance with the present invention.

Figure 5A:
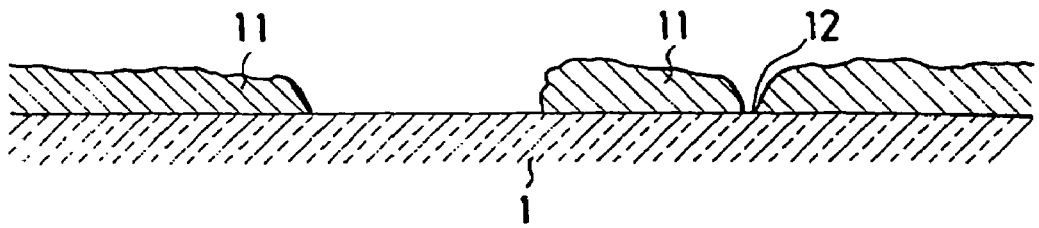
Figure 5B:
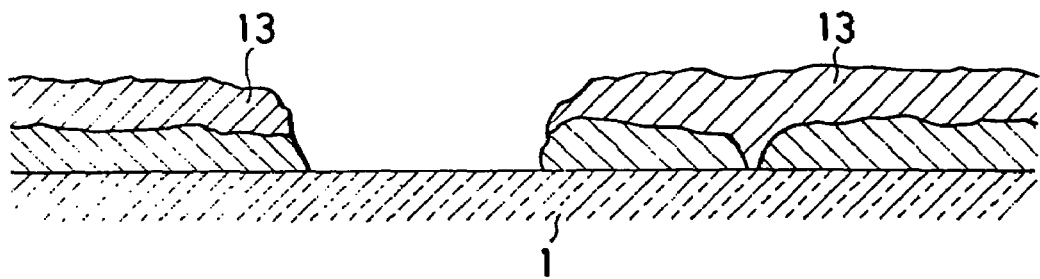
Figure 5C:
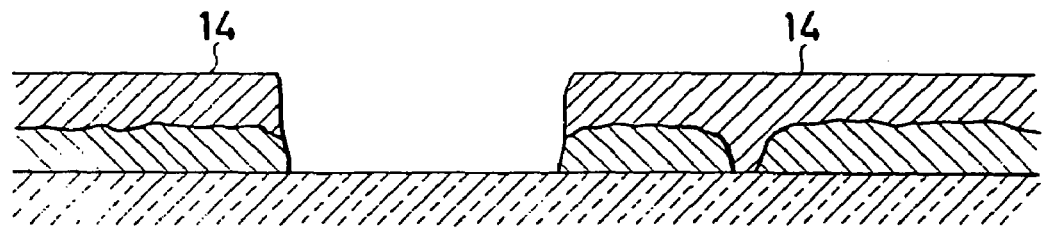

FIGS. 5(A) to 5(C) are cross-sectional views showing a method in accordance with the present invention.

Figure 6:
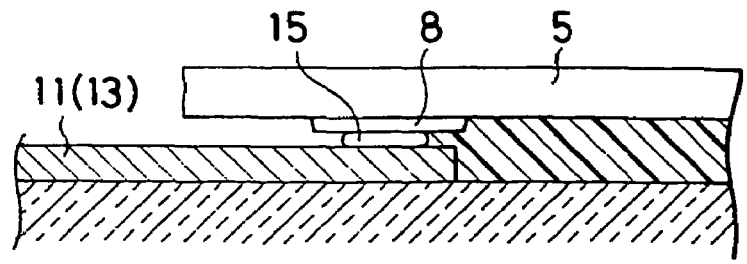

FIG. 6 is a cross-sectional view showing the contact portion between an IC chip and the conductive pattern produced by the method as illustrated in FIGS. 5(A) to 5(C).

DETAILED DESCRIPTION OF THE PREFERRED EMBODIMENTS

Referring to FIGS. 1(A) to 1(D), a method of forming a conductive pattern on a substrate for mounting thereon an IC chip in accordance with the present invention is shown. On a glass substrate 1 for liquid crystal device, only a portion of which is illustrated in the figures, a conductive pattern is formed by offset screen printing with a conductive paste (FIG. 1(A)). The conductive paste for the pattern is prepared by mixing, with an oil emulsion, "cover silver paste" (Prod No. 61900234) distributed by Detmeron, a West German company. The thickness of the pattern is 10 microns. Then, the substrate is baked in a nitrogen atmosphere in accordance with a temperature curve shown in FIG. 4(A), so that a contact region 2a and a sintered region largely consisting of silver (FIG. 1(B)) are formed. Also, on a portion of the pattern, another pattern is formed in the same manner by printing and baking (FIGS. 1(C) and 1(D)) to create a thick portion. The thickness of the thick portion is 30 microns after baking. Instead of printing, the pattern can be formed of ITO by sputtering with a good contact and a good conductivity. FIGS. 2(A) and 2(B) are plan view and a cross-sectional view showing the whole pattern on the substrate formed as explained above.

After the formation of the pattern, a transparent adhesive of epoxy resin mixed with Ni particles having 15 microns in average diameter is applied to the surface of the substrate which is to face the bottom surface and the electrode pads of an IC. The Ni particles are added into the epoxy resin adhesive at 50 mg per each 5 g of the adhesive. Then, the IC chip is mounted on the substrate with its aluminium pads contacting corresponding pads of the thick portion of the pattern, and the epoxy resin is hardened at 180° C. while pressing the IC against the substrate for 20 minutes force of 3 Kg using a jig. During the mounting of the IC chip, the alignment of the pads of the IC chip with the pattern on the substrate is checked by viewing from the bottom of the substrate through the transparent resin.

A resin which can be cured by a UV light may be also used as the adhesive. In this alternative, the resin is irradiated with UV light through the transparent substrate.

FIG. 3(A) is a partial cross-section view showing the contact of the IC chip 5 with the substrate 1 after the hardening of the epoxy adhesive 7. The distance between the Al pad 8 and the top of the thick portion 3 is designed to be 3 microns in which Ni particles 6 are caught therebetween to make the resistance of the contact low. Other particles contained in the epoxy resin 7 are situated between the IC chip and the substrate with 30 microns in distance, and do not damage the IC chip and the pattern 2 on the substrate 1. The area of the thick portion is preferably smaller than that of the corresponding pad of the pattern.

Next, a second embodiment of the invention is described. After the formation of the pattern by printing and baking in the same manner as the pattern 2 of the preceding embodiment, a thick portion 3 is formed by coating the prescribed portion with DAP1 (No. 61901143), a conductive adhesive distributed by Detmeron. Then, the IC chip is mounted on the substrate with its aluminium pads contacting corresponding lands of the thick portion of the pattern and pressed against the substrate with a jig, and the substrate is baked in accordance with the temperature curve shown in FIG. 4(B). FIG. 3(B) is a cross-sectional view showing the electrical connection between the IC chip and the pattern in accordance with this embodiment. By this embodiment, the method of the present invention has the advantage that few processing steps are required for mounting an IC chip and making the necessary contact with the IC chip.

Referring to FIGS. 5(A) to 5(C), a third embodiment of the invention is illustrated. In FIG. 5(A), a glass substrate 1 is coated by printing with a conductive paste consisting of Cu particles dispersed in a phenol resin, in order to form a prescribed pattern 11 including electrode lines for making contact with counterpart pads of the IC chip. The average diameter of the Cu particle is 5-10 microns. This conductive paste coating is then baked at 60° C. for 10 minutes and becomes thin by shrinking. The baked layer 11 might have a fissure 12.

Then, another layer 13 of the Cu conductive paste is superimposed over the layer 11 by printing on the baked Cu layer as shown in FIG. 5(B). The overlying Cu layer is also baked at 60° C. for 10 minutes. The fissure 12 is mended by this overlying pattern. The dispersion of the double-layered pattern in thickness is about 30 microns. The double-layered pattern is then pressed to produce an even top surface 14. The thickness of the double-layered pattern becomes about 20 microns after pressing. On the pattern is mounted an IC chip whose electrode pads to be in contact with the patterns are given Au bumps by plating and the IC chip is pressed against the substrate with an adhesive resin securing the IC chip in place.

Numerous characteristics, advantages, and embodiments of the invention have been described in detail in the foregoing description with reference to the accompanying drawings. However, the disclosure is illustrative only and the invention is not limited to the precise illustrated embodiments. Various changes and modifications may be effected therein by one skilled in the art without departing from the scope or spirit of the invention.

What is claimed is:

1. A method for manufacturing a semiconductor device comprising the steps of:
   forming a conductive pattern by printing on an insulating surface over a glass substrate;
   forming a conductive projection on a portion of said conductive pattern;
   mounting a semiconductor chip on said glass substrate utilizing a curable adhesive having conductive particles within the adhesive such that when said glass substrate and projection are adhered to the semiconductor chip, a conductive pad of said chip is electrically connected to said projection by said particles within said adhesive; and
   curing said adhesive,
   wherein the adhesive is a photo curable material and the adhesive is cured by an exposure of light through the glass substrate.

2. The method of claim 1, wherein the mounting step includes providing the curable adhesive having metal particles therein between the chip and the glass substrate, between the projection and the pad of the chip, and between the chip and the conductive pattern.

3. The method of claim 1, wherein the metal particles include nickel.

4. The method of claim 1, wherein said conductive pattern is formed of ITO.

5. The method of claim 1, wherein said conductive projection is formed by printing with a conductive paste.

6. The method of claim 5, further including the step of baking said conductive paste after printing.

7. The method of claim 1, wherein said semiconductor chip is an IC chip.

8. The method of claim 7, wherein said IC chip is an IC chip which drives a liquid crystal device.

9. The method of claim 1 wherein said semiconductor chip and said conductive pattern at least partly overlap each other.

10. The method of claim 9 wherein the gap between said conductive pattern and said semiconductor chip is larger than the diameter of said conductive particles.

11. The method of claim 1 wherein the printing of the conductive pattern is performed by offset printing.

12. A method for manufacturing a semiconductor device comprising the steps of:
    forming a conductive pattern by printing on an insulating surface over a glass substrate;
    forming a conductive projection by printing on a portion of said conductive pattern by applying a conductive paste including first metal particles;
    placing an adhesive on a portion of said glass substrate, said adhesive including an organic resin having second metal particles therein;
    mounting a semiconductor chip on said glass substrate, such that said organic resin bonds a conductive pad of said chip and said conductive projection; and
    curing the organic resin,
    wherein the adhesive is a photo curable material and the adhesive is cured by an exposure of light through the glass substrate.

13. The method of claim 12, wherein said metal particles comprise nickel.

14. The method of claim 12, wherein said conductive projection is formed by printing with a conductive paste.

15. The method of claim 12, wherein said conductive pattern is formed of ITO.

16. The method of claim 12, wherein said semiconductor chip is an IC chip.

17. The method of claim 12 wherein said semiconductor chip and said conductive pattern at least partly overlap each other.

18. The method of claim 12 wherein said semiconductor device is a liquid crystal device.

19. The method of claim 12 wherein the printing of the conductive pattern is performed by offset printing.

* * * * *